(12) United States Patent
Leidl et al.

(10) Patent No.: US 8,432,007 B2
(45) Date of Patent: Apr. 30, 2013

(54) MEMS PACKAGE AND METHOD FOR THE PRODUCTION THEREOF

(75) Inventors: Anton Leidl, Hohenbrunn (DE); Hans Krueger, Munich (DE); Alois Stelzl, Munich (DE); Wolfgang Pahl, Munich (DE); Stefan Seitz, Windach (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/075,936

(22) Filed: Mar. 30, 2011

(65) Prior Publication Data

US 2011/0186943 A1    Aug. 4, 2011

Related U.S. Application Data

(63) Continuation of application No. 12/092,439, filed as application No. PCT/DE2006/001945 on Nov. 6, 2006, now Pat. No. 8,169,041.

(30) Foreign Application Priority Data

Nov. 10, 2005    (DE) .......................... 10 2005 053 765

(51) Int. Cl.
*H01L 29/84* (2006.01)
(52) U.S. Cl.
USPC .......................................................... 257/416
(58) Field of Classification Search ................... 257/416
See application file for complete search history.

(56) References Cited

U.S. PATENT DOCUMENTS

| | | | |
|---|---|---|---|
| 2,105,010 A | 1/1938 | Sawyer | |
| 3,447,217 A | 6/1969 | Kumada | |
| 3,587,322 A | 6/1971 | Lobdell et al. | 73/420 |
| 3,726,002 A | 4/1973 | Greenstein et al. | |
| 3,735,211 A | 5/1973 | Kapnias | |
| 3,980,917 A | 9/1976 | Kakizaki et al. | |
| 4,127,840 A | 11/1978 | House | |
| 4,222,277 A | 9/1980 | Kurtz | |
| 4,277,814 A | 7/1981 | Giachino et al. | |
| 4,314,226 A | 2/1982 | Oguro et al. | |
| 4,424,419 A | 1/1984 | Chaput et al. | 179/111 E |
| 4,454,440 A | 6/1984 | Cullen | |

(Continued)

FOREIGN PATENT DOCUMENTS

| | | |
|---|---|---|
| CA | 2315417 | 2/2001 |
| DE | 198 06 818 | 11/1999 |

(Continued)

OTHER PUBLICATIONS

Barton et al., "Optimisation of the Coating of a Fiber Optical Sensor Embedded in a Corss-ply GFRP Laminate" Composites: Part A 33 (2002) pp. 27-34.

(Continued)

*Primary Examiner* — Jenny L Wagner
(74) *Attorney, Agent, or Firm* — Fish & Richardson P.C.

(57) ABSTRACT

A micro electro-mechanical systems (MEMS) package is described herein. The package includes a carrier substrate having a top side, a MEMS chip mounted on the top side of the carrier substrate, and at least one chip component on or above the top side of the carrier substrate or embedded in the carrier substrate. The package also includes a thin metallic shielding layer covering the MEMS chip and the chip component and forming a seal with the top side of the carrier substrate.

18 Claims, 6 Drawing Sheets

U.S. PATENT DOCUMENTS

| | | | |
|---|---|---|---|
| 4,456,796 A | 6/1984 | Nakagawa et al. | |
| 4,504,703 A | 3/1985 | Schneiter et al. | |
| 4,533,795 A | 8/1985 | Baumhauer | |
| 4,545,440 A | 10/1985 | Treadway | 173/132 |
| 4,558,184 A | 12/1985 | Busch-Vishniac et al. | |
| 4,628,740 A | 12/1986 | Ueda et al. | |
| 4,641,054 A | 2/1987 | Takahata et al. | |
| 4,691,363 A | 9/1987 | Khanna | |
| 4,737,742 A | 4/1988 | Takoshima et al. | |
| 4,776,019 A | 10/1988 | Miyatake | |
| 4,816,125 A | 3/1989 | Muller et al. | |
| 4,817,168 A | 3/1989 | Fidi | |
| 4,825,335 A | 4/1989 | Wilner | |
| 4,866,683 A | 9/1989 | Phillips | 367/157 |
| 4,908,805 A | 3/1990 | Sprenkels et al. | |
| 4,910,840 A | 3/1990 | Sprenkels et al. | |
| 4,984,268 A | 1/1991 | Brown et al. | |
| 4,985,926 A | 1/1991 | Foster | |
| 5,059,848 A | 10/1991 | Mariani | |
| 5,091,051 A | 2/1992 | Greer | |
| 5,101,543 A | 4/1992 | Cote et al. | |
| 5,146,435 A | 9/1992 | Bernstein | |
| 5,151,763 A | 9/1992 | Marek et al. | |
| 5,153,379 A | 10/1992 | Guzuk et al. | |
| 5,178,015 A | 1/1993 | Loeppert et al. | |
| 5,184,107 A | 2/1993 | Maurer | 338/42 |
| 5,216,490 A | 6/1993 | Greiff et al. | 73/517 R |
| 5,257,547 A | 11/1993 | Boyer | |
| 5,357,807 A | 10/1994 | Guckel et al. | |
| 5,394,011 A | 2/1995 | Yamamoto et al. | |
| 5,408,731 A | 4/1995 | Berggvist et al. | |
| 5,449,909 A | 9/1995 | Kaiser et al. | |
| 5,452,268 A | 9/1995 | Bernstein | |
| 5,459,368 A | 10/1995 | Onishi et al. | |
| 5,465,008 A | 11/1995 | Goetz et al. | |
| 5,477,008 A | 12/1995 | Pasqualoni et al. | |
| 5,490,220 A | 2/1996 | Loeppert | |
| 5,506,919 A | 4/1996 | Roberts | |
| 5,531,787 A | 7/1996 | Lesinski et al. | |
| 5,545,912 A | 8/1996 | Ristic et al. | |
| 5,573,435 A | 11/1996 | Grabbe et al. | |
| 5,592,391 A | 1/1997 | Muyshondt et al. | |
| 5,593,926 A | 1/1997 | Fujihira | |
| 5,650,685 A | 7/1997 | Kosinski et al. | 310/316 |
| 5,659,195 A | 8/1997 | Kaiser et al. | |
| 5,712,523 A | 1/1998 | Nakashima et al. | |
| 5,739,585 A | 4/1998 | Akram et al. | 257/698 |
| 5,740,261 A | 4/1998 | Loeppert et al. | |
| 5,748,758 A | 5/1998 | Menasco, Jr. et al. | |
| 5,821,665 A | 10/1998 | Onishi et al. | |
| 5,831,262 A | 11/1998 | Greywall et al. | |
| 5,838,551 A | 11/1998 | Chan | |
| 5,852,320 A | 12/1998 | Ichihashi | |
| 5,870,482 A | 2/1999 | Loeppert et al. | |
| 5,872,397 A | 2/1999 | Diffenderfer et al. | |
| 5,886,876 A | 3/1999 | Yamaguchi | |
| 5,889,872 A | 3/1999 | Sooriakumar et al. | |
| 5,901,046 A | 5/1999 | Ohta et al. | |
| 5,923,995 A | 7/1999 | Kao et al. | |
| 5,939,968 A | 8/1999 | Nguyen et al. | |
| 5,990,418 A | 11/1999 | Bivona et al. | 174/52.4 |
| 5,999,821 A | 12/1999 | Kaschke | |
| 6,012,335 A | 1/2000 | Bashir et al. | |
| 6,052,464 A | 4/2000 | Harris | |
| 6,057,222 A | 5/2000 | Pahl et al. | |
| 6,075,867 A | 6/2000 | Bay et al. | |
| 6,078,245 A | 6/2000 | Fritz et al. | |
| 6,108,184 A | 8/2000 | Minervini et al. | |
| 6,118,881 A | 9/2000 | Quinlan et al. | |
| 6,136,175 A | 10/2000 | Stelzl et al. | |
| 6,136,419 A | 10/2000 | Fasano et al. | |
| 6,150,753 A | 11/2000 | DeCastro | 310/334 |
| 6,157,546 A | 12/2000 | Petty et al. | |
| 6,163,071 A | 12/2000 | Yamamura | |
| 6,178,249 B1 | 1/2001 | Hietanen et al. | |
| 6,182,342 B1 | 2/2001 | Sawin | |
| 6,187,249 B1 | 2/2001 | Lewellin | 264/463 |
| 6,191,928 B1 | 2/2001 | Rector et al. | |
| 6,236,145 B1 | 5/2001 | Biernacki | |
| 6,242,842 B1 | 6/2001 | Pahl et al. | |
| 6,282,072 B1 | 8/2001 | Minervini et al. | |
| 6,310,420 B1 | 10/2001 | Pahl et al. | |
| 6,324,907 B1 | 12/2001 | Halteren et al. | 73/433 |
| 6,398,943 B1 | 6/2002 | Arens-Fischer et al. | |
| 6,400,065 B1 | 6/2002 | Toda et al. | 310/334 |
| 6,413,408 B1 | 7/2002 | Berger et al. | |
| 6,433,412 B2 | 8/2002 | Ando et al. | 257/678 |
| 6,437,449 B1 | 8/2002 | Foster | |
| 6,439,869 B1 | 8/2002 | Seng et al. | |
| 6,449,828 B2 | 9/2002 | Pahl et al. | |
| 6,492,194 B1 | 12/2002 | Bureau et al. | 438/106 |
| 6,519,822 B1 | 2/2003 | Stelzl et al. | |
| 6,522,762 B1 | 2/2003 | Mullenborn et al. | |
| 6,528,924 B1 | 3/2003 | Stelzl et al. | |
| 6,530,515 B1 | 3/2003 | Glenn et al. | |
| 6,555,758 B1 | 4/2003 | Stelzl et al. | |
| 6,566,672 B1 | 5/2003 | Schlough et al. | |
| 6,594,369 B1 | 7/2003 | Une | |
| 6,613,605 B2 | 9/2003 | Pace | |
| 6,614,911 B1 | 9/2003 | Watson et al. | 381/86 |
| 6,621,392 B1 | 9/2003 | Volant et al. | |
| 6,625,031 B2 | 9/2003 | Sano et al. | |
| 6,649,446 B1 | 11/2003 | Goetz et al. | |
| 6,674,159 B1 | 1/2004 | Peterson et al. | |
| 6,685,168 B1 | 2/2004 | Stelzl et al. | |
| 6,710,840 B2 | 3/2004 | Umemoto | |
| 6,722,030 B1 | 4/2004 | Stelzl et al. | |
| 6,732,588 B1 | 5/2004 | Mullenborn et al. | 72/715 |
| 6,781,231 B2 | 8/2004 | Minervini | 257/704 |
| 6,800,987 B2 | 10/2004 | Toda | 310/348 |
| 6,809,413 B1 | 10/2004 | Peterson et al. | 257/630 |
| 6,829,131 B1 | 12/2004 | Loeb et al. | 361/234 |
| 6,838,739 B2 | 1/2005 | Stelzl et al. | |
| 6,838,972 B1 | 1/2005 | Minervini | |
| 6,871,388 B2 | 3/2005 | Ishino et al. | |
| 6,904,155 B2 | 6/2005 | Yonehara et al. | 381/174 |
| 6,909,183 B2 | 6/2005 | Feiertag et al. | |
| 6,924,429 B2 | 8/2005 | Kasai et al. | 174/52.3 |
| 6,924,974 B2 | 8/2005 | Stark | |
| 6,930,364 B2 | 8/2005 | Bruner | 257/414 |
| 6,982,380 B2 | 1/2006 | Hoffmann et al. | |
| 7,003,127 B1 | 2/2006 | Sjursen | |
| 7,053,456 B2 | 5/2006 | Matsuo | |
| 7,072,482 B2 | 7/2006 | Van Doorn et al. | 381/355 |
| 7,080,442 B2 | 7/2006 | Kawamura et al. | |
| 7,091,651 B2 | 8/2006 | Kinoshita | |
| 7,092,539 B2 | 8/2006 | Sheplak et al. | 381/114 |
| 7,094,626 B2 | 8/2006 | Stelzl et al. | |
| 7,145,283 B2 | 12/2006 | Takeuchi et al. | |
| 7,146,016 B2 | 12/2006 | Pedersen | |
| 7,166,910 B2 | 1/2007 | Minervini | |
| 7,242,089 B2 | 7/2007 | Minervini | 257/704 |
| 7,259,041 B2 | 8/2007 | Stelzl et al. | 438/106 |
| 7,298,856 B2 | 11/2007 | Tajima et al. | |
| 7,381,589 B2 | 6/2008 | Minervini | |
| 7,388,281 B2 * | 6/2008 | Krueger et al. | 257/678 |
| 7,434,305 B2 | 10/2008 | Minervini | |
| 7,439,616 B2 | 10/2008 | Minervini | |
| 7,492,019 B2 | 2/2009 | Carley | |
| 7,518,201 B2 | 4/2009 | Stelzl et al. | |
| 7,518,249 B2 | 4/2009 | Krueger et al. | |
| 7,537,964 B2 | 5/2009 | Minervini | |
| 7,544,540 B2 | 6/2009 | Bauer et al. | |
| 7,608,789 B2 | 10/2009 | Krueger et al. | |
| 7,692,288 B2 | 4/2010 | Zhe | |
| 7,903,831 B2 | 3/2011 | Song | |
| 8,018,049 B2 | 9/2011 | Minervini | |
| 8,169,041 B2 | 5/2012 | Pahl et al. | |
| 8,184,845 B2 | 5/2012 | Leidl et al. | |
| 8,229,139 B2 | 7/2012 | Pahl | |
| 2001/0010444 A1 | 8/2001 | Pahl et al. | |
| 2002/0067663 A1 | 6/2002 | Loeppert et al. | |
| 2002/0074239 A1 | 6/2002 | Berger et al. | |
| 2002/0076910 A1 | 6/2002 | Pace | |
| 2002/0084722 A1 | 7/2002 | Vaughn | |
| 2002/0102004 A1 | 8/2002 | Minervini | |
| 2002/0110256 A1 | 8/2002 | Watson et al. | 381/389 |

| | | |
|---|---|---|
| 2003/0007651 A1 | 1/2003 | Nakashima et al. |
| 2003/0010530 A1 | 1/2003 | Scheel et al. |
| 2003/0034536 A1 | 2/2003 | Scheeper et al. ............... 257/419 |
| 2003/0035558 A1 | 2/2003 | Kawamura et al. ........... 381/113 |
| 2003/0047806 A1 | 3/2003 | Stelzl et al. |
| 2003/0124829 A1 | 7/2003 | Pace |
| 2003/0133588 A1 | 7/2003 | Pedersen |
| 2003/0151133 A1 | 8/2003 | Kinayman et al. |
| 2003/0153116 A1 | 8/2003 | Carley et al. |
| 2004/0032705 A1 | 2/2004 | Ma |
| 2004/0046245 A1 | 3/2004 | Minervini |
| 2004/0058473 A1 | 3/2004 | Feiertag et al. |
| 2004/0064941 A1 | 4/2004 | Dozier et al. |
| 2004/0118595 A1 | 6/2004 | Flammer et al. |
| 2004/0150939 A1 | 8/2004 | Huff |
| 2004/0161530 A1 | 8/2004 | Stark |
| 2004/0231872 A1 | 11/2004 | Arnold et al. |
| 2004/0237299 A1 | 12/2004 | Stelzl et al. |
| 2004/0239449 A1 | 12/2004 | Stelzl et al. |
| 2005/0018864 A1 | 1/2005 | Minervini ..................... 381/175 |
| 2005/0034888 A1 | 2/2005 | Hoffmann et al. |
| 2005/0040734 A1 | 2/2005 | Kinoshita |
| 2005/0069164 A1 | 3/2005 | Muthuswamy et al. |
| 2005/0121785 A1 | 6/2005 | Stelzl et al. |
| 2005/0124181 A1 | 6/2005 | Brown et al. |
| 2005/0185812 A1 | 8/2005 | Minervini |
| 2005/0218488 A1 | 10/2005 | Matsuo |
| 2005/0242420 A1 | 11/2005 | Matsuda et al. |
| 2005/0270135 A1 | 12/2005 | Chua et al. |
| 2006/0082260 A1 | 4/2006 | Kinoshita |
| 2006/0151203 A1 | 7/2006 | Krueger et al. |
| 2006/0157841 A1 | 7/2006 | Minervini ..................... 257/680 |
| 2006/0249802 A1 | 11/2006 | Stelzl et al. |
| 2007/0069354 A1 | 3/2007 | Dangelmaier et al. |
| 2007/0082421 A1 | 4/2007 | Minervini ........................ 438/50 |
| 2007/0099327 A1 | 5/2007 | Hartzell et al. .................. 438/51 |
| 2007/0127982 A1 | 6/2007 | Bohlen et al. |
| 2007/0189558 A1 | 8/2007 | Ogura et al. |
| 2007/0201715 A1 | 8/2007 | Minervini ..................... 381/355 |
| 2007/0202627 A1 | 8/2007 | Minervini ........................ 438/51 |
| 2007/0217635 A1 | 9/2007 | Ogura et al. |
| 2007/0222056 A1 | 9/2007 | Bauer et al. |
| 2008/0038577 A1 | 2/2008 | Kruger et al. |
| 2008/0048317 A1 | 2/2008 | Krueger et al. |
| 2008/0247585 A1 | 10/2008 | Leidl et al. |
| 2008/0279407 A1 | 11/2008 | Pahl |
| 2009/0001553 A1 | 1/2009 | Pahl et al. |
| 2009/0071710 A1 | 3/2009 | Stelzl et al. |
| 2009/0080682 A1 | 3/2009 | Ogura et al. |
| 2009/0104415 A1 | 4/2009 | Schmajew et al. |
| 2009/0127697 A1 | 5/2009 | Pahl |
| 2011/0186943 A1 | 8/2011 | Pahl et al. |
| 2011/0210409 A1 | 9/2011 | Minervini |

FOREIGN PATENT DOCUMENTS

| | | |
|---|---|---|
| DE | 199 61 842 | 7/2001 |
| DE | 101 45 100 | 5/2002 |
| DE | 10303263 | 8/2004 |
| DE | 202 005 001 559 | 6/2005 |
| DE | 102005008512 | 8/2006 |
| EP | 0077615 | 4/1983 |
| EP | 0774888 | 5/1997 |
| EP | 0 742 643 B1 | 2/2002 |
| FR | 2 799 883 | 4/2001 |
| JP | 55-134942 | 10/1980 |
| JP | 55-150575 | 10/1980 |
| JP | 1955-134942 | 10/1980 |
| JP | 57-100754 | 6/1982 |
| JP | 1957-100754 | 6/1982 |
| JP | 57-207500 | 12/1982 |
| JP | 61-033509 | 12/1982 |
| JP | 1957-207500 | 12/1982 |
| JP | 1961-033509 | 12/1982 |
| JP | 58-030394 | 2/1983 |
| JP | 1958-030394 | 2/1983 |
| JP | 58-203016 | 11/1983 |
| JP | 1958-203016 | 11/1983 |
| JP | 62-230297 | 10/1987 |
| JP | 1962-230297 | 10/1987 |
| JP | 03-116899 | 5/1991 |
| JP | 2003-116899 | 5/1991 |
| JP | 04-281696 | 10/1992 |
| JP | 2004-281696 | 10/1992 |
| JP | 06-81133 | 11/1994 |
| JP | 06-334298 | 12/1994 |
| JP | 2006-334298 | 12/1994 |
| JP | 7-212180 | 8/1995 |
| JP | 7-212181 | 8/1995 |
| JP | 07-297667 | 11/1995 |
| JP | 08-043435 | 2/1996 |
| JP | 2008-043435 | 2/1996 |
| JP | 05-299963 | 11/1996 |
| JP | 09-153762 | 6/1997 |
| JP | 10-321666 | 12/1998 |
| JP | 11-026628 | 1/1999 |
| JP | 11-508101 | 7/1999 |
| JP | 2011-508101 | 7/1999 |
| JP | 11-274892 | 10/1999 |
| JP | 2001-157298 | 6/2001 |
| JP | 2001-339796 | 12/2001 |
| JP | 2002-134875 | 5/2002 |
| JP | 2003-078981 | 3/2003 |
| JP | 2003-508998 | 3/2003 |
| JP | 2003-304595 | 10/2003 |
| JP | 2004-079776 | 3/2004 |
| JP | 2004-088566 | 3/2004 |
| JP | 2004-153408 | 5/2004 |
| JP | 2004-229200 | 8/2004 |
| JP | 2004-537182 | 12/2004 |
| JP | 2005-198051 | 7/2005 |
| JP | 2005-241380 | 9/2005 |
| JP | 2005-244642 | 9/2005 |
| JP | 2005-249666 | 9/2005 |
| JP | 2005-294462 | 10/2005 |
| JP | 2007-060661 | 3/2007 |
| JP | 2007-524514 | 8/2007 |
| JP | 2008-532369 | 8/2008 |
| JP | 2009-501442 | 1/2009 |
| WO | 97/01258 | 1/1997 |
| WO | 99/43084 | 8/1999 |
| WO | 99/56390 | 11/1999 |
| WO | 00/42636 | 7/2000 |
| WO | 00/70630 | 11/2000 |
| WO | 01/19134 | 3/2001 |
| WO | 01/20948 | 3/2001 |
| WO | 01/26136 | 4/2001 |
| WO | 01/41497 | 6/2001 |
| WO | 02/15636 | 2/2002 |
| WO | 02/45463 | 6/2002 |
| WO | 03/017364 | 2/2003 |
| WO | 02/17364 | 3/2004 |
| WO | 2004/019490 | 3/2004 |
| WO | 2004/051745 | 6/2004 |
| WO | 2005/036698 | 4/2005 |
| WO | 2005/086532 | 9/2005 |
| WO | 2005/086534 | 9/2005 |
| WO | WO2005/086535 | 9/2005 |
| WO | 2005/102910 | 11/2005 |
| WO | 2006/089638 | 8/2006 |
| WO | 2006/089641 | 8/2006 |
| WO | 2007/010361 | 1/2007 |
| WO | 2007/022249 | 2/2007 |

OTHER PUBLICATIONS

Bergqvist et al., "A Silicon Condenser Microphone Using Bond and Etch-Back Technology", Sensors and Actuators A, vol. 45, pp. 115-124 (1994).

English translation of Written Opinion for PCT/DE2006/001945.

International Preliminary Report on Patentability in Application No. PCT/EP05/004309, dated Nov. 29, 2006.

International Preliminary Report on Patentability in Application No. PCT/DE2006/001736, dated Apr. 29, 2008.

International Preliminary Report on Patentability in Application No. PCT/DE2006/001946, dated Jun. 11, 2008.

International Search Report and Written Opinion in Application No. PCT/EP05/004309, dated Sep. 13, 2005.

International Search Report and Written Opinion in Application No. PCT/DE2006/001946, dated Feb. 22, 2007.
International Search Report and Written Opinion in Application No. PCT/EP03/06596, dated Jan. 20, 2004.
International Search Report and Written Opinion in Application No. PCT/DE2006/001736, dated Mar. 12, 2007.
International Search Report from corresponding PCT Application No. PCT/DE2006/001945, mailed Mar. 28, 2007, 6 pages.
Oda et al., "New Nanostructured Film Making Method Using Ultra Fine Particles"; pp. 21-26.
Selmeier et al., "Recent Advances in Saw Packaging", IEEE Ultrasonics Symposium; 2001; pp. 283-292.
Torkkeli et al., "Capacitive Silicon Microphone", Physica Scripta., vol. T79, pp. 275-278 (1999).
Wikipedia, "Flip Chip", [online] Retrieved from the Internet: <URL: http://en.wikipedia.org/wiki/ Flip_chip>, [retrieved on Nov. 15, 2011].
Machine Translation of German Publication No. DE10303263A1, published Aug. 2004.
"Small Times Magazine Best of Small Tech Awards Recognize Micro and Nano Technologies Affecting Today's World", [online] Retrieved from the Internet: <URL: http://www.nanotechwire.com/news.asp?nid=539>, [Nov. 10, 2003].
Action and Response History in U.S. Appl. No. 10/523,875.
Action and Response History in U.S. Appl. No. 11/573,610.
Action and Response History in U.S. Appl. No. 11/578,854.
Action and Response History in U.S. Appl. No. 12/092,439.
Action and Response History in U.S. Appl. No. 13/075,936.
Arnold et al., "MEMS-Based Acoustic Array Technology", 40th AIAA Aerospace Sciences Meeting and Exhibit, (Jan. 2002).
Arnold, D., "A Directional Acoustic Array using Silicon Micromachined Piezoresistive Microphones", J. of Acoustic Soc. Am., vol. 113, pp. 289-298 (Jan. 2003).
Arnold, David P., "A MEMS-Based Directional Acoustic Array for Aeroacoustic Measurements". Master's Thesis, Univ. of Florida (2001).
Bay J. et al "Design of a Silicon Microphone with Differential Readout of a Sealed Double Parallel-Plate Capacitor" Int. Conf. Eurosensors, Jun. 25, 1995, pp. 700-703, XP010305041.
Becker, K. et al., "MEMS Packaging—Techological Solutions for a Si-Microphone", Fraunhofer Inst. for Reliability and Micro Integration, Berlin; pp. 405-406, (Mar. 2004).
Beaver et al., "BICMOS Compatible Silicon Microphone Packaged as Surface Mount Device", Sensors Expo (1999).
Bouchard et al., "Dynamic Times for MEMS Microphones: MEMS Microphone Market & Supplier Analysis 2006-2013", iSuppli Corporation (2009).
Electronic Materials handbook, p. 483 (Fig. 1), ASM Int'l., (1989).
Foresight Institute, "Nano 50 Awards Announced", [online] Retrieved from the Internet:<URL: http://www.foresight.org/nanodot/?p=1990>, (Jul. 2005).
Gale, Bruce K., "MEMS Packaging", Microsystems Principles (Oct. 2001).
Giasolli, Robert, "MEMS Packaging Introduction", (Nov. 2000).
Gilleo, "MEMS/MOEMS Packaging: Concepts, Designs, Materials & Processes", MEMS and MOEMS Packaging Challenges and Strategies, McGraw-Hill Companies, Inc., ch. 3:84-102, (2005).
Gileo, K. Handbook of flexible circuits, Gilleo, K. (ed), Van Nostrand Reinhold, 1992, pp. 145-166 [Ch. 8—Integrated Features].
Gileo, Ken, ed., Excerpt from Area Array Packaging Handbook, (2002).
Hannenmann et al., eds., Semiconductor Packaging: A Multidisciplinary Approach (1994).
Harper, Chas. et al., Electronic Packaging, Microelectronics and Interconnection Dictionary, pp. 139, 190-191 (1993).
Harper, Chas., ed., Electronic Packaging and Interconnection Handbook, 3rd Ed., McGraw-Hill, pp. 7.34 to 7.38 (2000).
Hayes et al., "Micro-jet printing of polymers for electronics manufacturing" IEEE; pp. 168-173, XP 002342861 (1998).
Hayes et al., "Printing systems for MEMS packaging" vol. 4558, 2001, pp. 206-214, XP 002342860.

Henning et al., "Mircrofluidic MEMS for Semiconductor Processing", IEEE Trans. on Components, Packaging and Manufacturing Technology, Pt. B, vol. 21(4), pp. 329-337 (Nov. 1998).
Hsieh, W. H. et al "A Micromachined Thin-film Teflon Electret Microphone" Dept. of Electrical Engineering, California Inst. of Technology ; vol. 1 p. 2B2.02 IEEE, 1997.
Hsu, "MEMS Packaging: Fundamentals of MEMS Packaging", INSPEC, Inst. of Electrical Engineers, pp. 17-19 (2004).
Imai, Nobuomi, "A New Piezoelectric Microphone with Divided Electrodes and its Applications" J. Acoust. Soc. Jpn. (E) 11,6 (1990) pp. 327-333.
International Preliminary Report on Patentability and Written Opinion for PCT/EP2006/001120, dated Sep. 11, 2007.
International Preliminary Report on Patentability and Written Opinion for PCT/EP2006/001121, dated Sep. 11, 2007.
International Preliminary Report on Patentability in Application No. PCT/EP2006/001116, dated Sep. 11, 2007 (incl. Written Opinion).
International Search Report and Written Opinion in Application No. PCT/EP2005/008373, dated Nov. 8, 2005.
International Search Report in Application No. PCT/EP2006/001116, dated Aug. 31, 2006.
International Search Report in Application No. PCT/EP2006/001120, dated Oct. 26, 2006.
International Search Report in Application No. PCT/EP2006/001121, dated Jul. 7, 2006.
Jedec Standard, "Terms, Definitions and Letter Symbols for Microelectronic Devices", JEDEC Solid State Technology Assoc., Electronic Industries Alliance, JESD99A (Rev. of Feb. 2000, Mar. 2007).
Kress et al., "Integrated Silicon Pressure Sensor for Automotice Applications with Electronic Trimming", SAE Document 950533 (1995).
Lau, John H., Ed., Ball Grid Array Technology, McGraw Hill, Inc., ISBN 0-07-03608-X, (Pub. 1995).
Lukes M. "Silicon Condenser Microphone: Electroacoustic Model and Simulation" Czech Tech. University in Prague, Faculty of Electrical Engineering, Sep. 26, 2001, pp. 57-66.
Luthra, Mukluk, Process challenges and solutions for embedding Chip-On-Board into mainstream SMT assembly, pp. 426-433, Proc. of the 4th Int'l. Symposium on Electronic Materials and Packaging (Dec. 2002).
Maluf, Nadim, "An Introduction to Microelectromechanical Systems Engineering;The Box: Packaging for MEMS", ch. 6:201-203 (2000).
National Semiconductor Corp., "Acoustic Applications of Pressure Transducers", Pressure Transducer Handbook, pp. 12-1 to 12-5, (1977).
National Semiconductor Corp., "Configurations, Packaging and Environment", Pressure Transducer Handbook, pp. 4-2 to 4-5, (1977).
Neumann J. J. et al "A Fully-integrated CMOS-MEMS Audio Microphone" 12th Intl Conf. on Solid State Sensors, Actuators and Microsystems, Boston, Jun. 8-12, 2003, pp. 230-233.
Niu M-N et al "Piezoeclectric Bimorph Microphone Built on Micromachined Parylene Diaphragm" J. of Microelectrochemical Systems, vol. 12, No. 6, Dec. 2003; pp. 892-898, XP001200226, ISSN 1057-7157.
Notification of reasons for Refusal in Japanese Patent Application No. 2007-556514, dated Jul. 13, 2011.
Notification of reasons for Refusal in Japanese Patent Application No. 2007-556515, dated Jun. 23, 2011.
Notification of reasons for Refusal in Japanese Patent Application No. 2007-556516, dated Sep. 22, 2011.
Notification of reasons for Refusal in Japanese Patent Application No. 2008-539239, dated Sep. 22, 2011.
O'Neal, Chad et al., Challenges in the Packaging of MEMS, IEEE Int'l Symposium on Advanced Packaging Materials (1999).
Pecht, Michael, ed., Handbook of Electronic Package Design, pp. 1-5, Fig. 1.1 (1991).
Petersen et al., "Silicon Accelerometer Family: Manufactured for Automotive Applications", (1992).
Premachandran, C. S. et al., "Si-based Microphone Testing Methodology and Noise Reduction", Proc. of SPIE, vol. 4018, p. 588 (2000).
Prosecution History in Re-Exam Serial No. 90/009,739 (RE of US7242,089).

Prosecution History in Re-Exam Serial No. 90/009,740 (RE of US6,781,231).
Prosecution History in Re-Exam Serial No. 90/000,509 (RE of US6,781,231).
Prosecution History in Re-Exam Serial No. 90/000,513 (RE of US7,242,089).
Prosecution History in Re-Exam Serial No. 90/000,515 (RE of US7,242,089).
Ramesham, Rajeshuni et al., Challenges in Interconnection and Packaging of Microelectromechanical Systems (MEMS), Electronic Components and Technology Conference (2000).
Schweber & Clark, "And the statuette goes to . . . ", [online] Retrieved from the Internet:<URL: www.tmworld.com/file/13638-509581.pdf?force=true>, Electronics Design, Strategy, News (EDN), (Mar. 2005).
State Intellectual Property Office, P.R. China, Chinese Office Action in CH Patent Application No. 2008-539238, mailed Nov. 11, 2011, 6 pages.
Torkkeli et al., "Capacitive Microphone with low-stress polysilicon membrane and high-stress polysilicon back plate", Sensors and Actuators 85, pp. 116-123 (Aug. 25, 2000).
Tummala, Rao, ed., Fundamentals of Microsystems Packaging, McGraw-Hill Companies, Inc., Ch. 14:560-561 (2001).
Van der Donk et al "Amplitude-modulated Electromechanical Feedback System for Silicon Condenser Microphones" J. Micromech. Microeng. 2 (1992) 211-214, XP020069302.
van Heeren et al., "Overview of MEMS Process Technologies for High Volume Electronics", 17 pgs. (Pub. Date: 2005 or later).
Zhao Y. et al "MEMS-Based Piezoelectric Microphone for Biomedical Applications" MEMES Sensors and Actuators Lab (MSAL), Dept. of electrical and Computer Engineering, The Inst. for Systems Research, U. of Maryland.
Notification of Reasons for Refusal (english translation) in Japanese Patent Application No. 2008-535876, dated Dec. 8, 2011.
Notification of reasons for Refusal in Japanese Patent Application No. 2007-556516, dated Apr. 12, 2012.
Notification of Reasons for Refusal (english translation) in Japanese Patent Application No. 2008-535876, dated Jul. 11, 2012.
Action and Response History in U.S. Appl. No. 11/816,960.
Action and Response History in U.S. Appl. No. 11/816,964.
Action and Response History in U.S. Appl. No. 11/816,969.
Action and Response History in U.S. Appl. No. 12/090,529.
Action and Response History in U.S. Appl. No. 12/092,423.

* cited by examiner

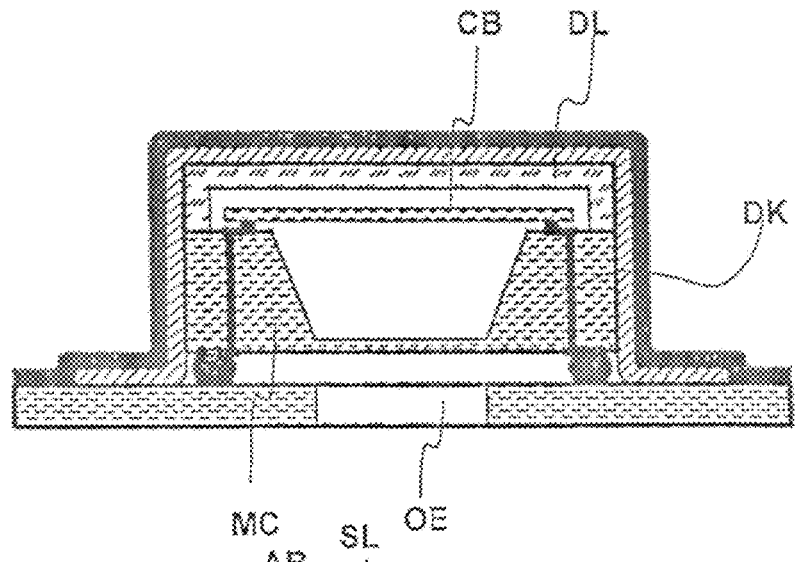
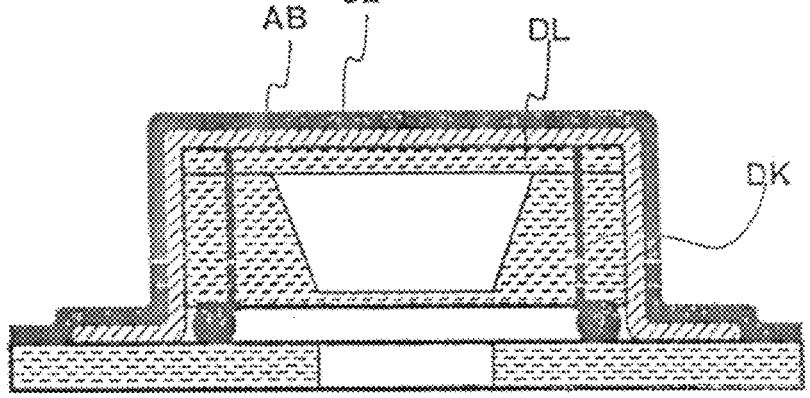
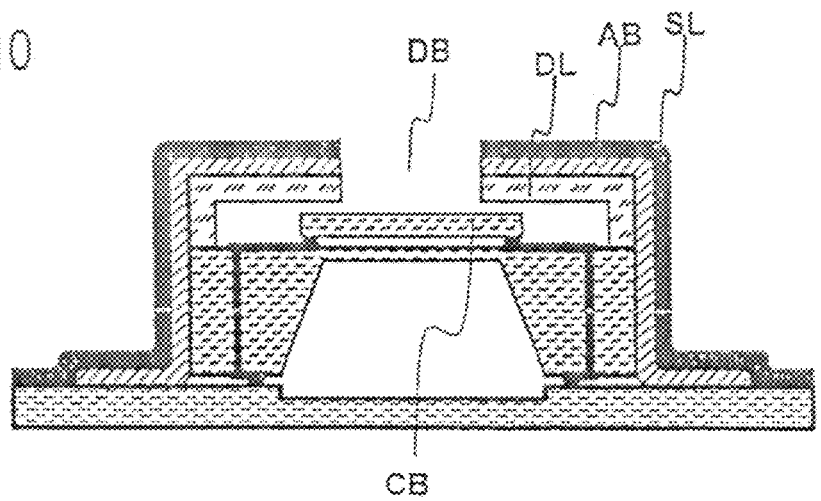

MEMS PACKAGE AND METHOD FOR THE PRODUCTION THEREOF

CROSS REFERENCE TO RELATED APPLICATIONS

This is a continuation application that claims the benefit pursuant to 35 U.S.C. §121 of U.S. National application Ser. No. 12/092,439, filed Aug. 25, 2008, which application claims the benefit pursuant to 35 USC §120 to WIPO PCT/DE2006/001945 filed Nov. 6, 2006, which claims the benefit of German Patent Application No. 102005053765.0 filed Nov. 10, 2005. Each of these applications is incorporated by reference in its entirety.

BACKGROUND

There is an enormous pressure to miniaturize the electronic components of mobile communications devices. This applies especially for MEMS components (micro electro-mechanical systems), such as, e.g., microphones, which have a relatively high-profile design and thus represent limitations for the device design of mobile communications devices.

From the published US Patent Application No. 2005/0185812A1, a microphone housing is known in which a microphone constructed as a MEMS component is arranged together with a semiconductor chip on a base plate, and in which the MEMS package comprises a common cap with which the MEMS component is covered against the base plate. The base plate can have a sound entrance opening in its bottom side opposite the cap, so that the entire component can be soldered onto the printed circuit board reverse side, which faces away from the sound source. For this purpose, a corresponding hole must be provided in the printed circuit board. In another construction, the sound entrance opening can be provided in a conventional way on the top side in the cap, so that the component with the base plate can be applied onto the surface of the printed circuit board facing the sound source.

For mobile communications devices, additional problems result due to the small distance of the antenna from the electronic components, which are therefore exposed to electromagnetic noise that can negatively influence the functioning of the components.

SUMMARY

The task of the present invention is to specify a MEMS package of smaller structural size which constitutes a secure enclosure for a MEMS component, which better shields electromagnetic interference, and at the same time is easy to produce.

The MEMS package according to the invention is built on a mechanically stable carrier substrate. A MEMS chip is mounted on its top side. Likewise, at least one chip component is arranged on or above the top side of the carrier substrate or embedded in this substrate. A metallic shielding layer covers the MEMS chip and the chip component and forms a seal with the top side of the carrier substrate in an annular, closed peripheral region. The MEMS chip and chip component have electrical contacts which are connected electrically to external contacts on a surface of the carrier substrate.

The shielding layer is a thin metallization layer which can be deposited directly onto the MEMS chip and/or the chip component. In addition, however, an enclosure can be provided at least between the MEMS chip and shielding layer. The shielding layer is preferably electrically connected at one or more positions to suitable electrically conductive structures of the carrier substrate. Such structures can be ground potential, additional shielding surfaces, or external connections.

A MEMS package is obtained which has only a minimal overall height. The shielding layer guarantees electromagnetic shielding, which allows the use of the MEMS package in an environment in which the irradiation of electromagnetic waves is to be taken into account. Such an environment can be, for example, the interior of a mobile radio terminal device.

The MEMS chip realizes an arbitrary sensor or actuator function and can be realized in the form of a structured thin-film construction on a base chip used as a carrier. As an alternative or in addition to the thin-film construction, the MEMS chip itself can be structured and can optionally even be monolithic for realizing the sensor or actuator function. This side of the MEMS chip is designated below as the active side. The MEMS chip has metallic contact surfaces by means of which it can be connected electrically. The contact surfaces can be arranged on the active side or on the opposite "passive" side of the base chip. In the latter case, the electrical connection of the contact surfaces to electrically conductive structures of the active side can be performed by means of a connection running through the base chip. This can be constructed as a via contact, that is, as a hole or borehole, which is filled with an electrically conductive material, and in particular, with metal. However, it is also possible to use as the base chip a semiconductor chip that is set to be electrically conductive in the region of the via contact.

The external contacts of the MEMS package are located on one surface of the carrier substrate, preferably on the surface opposite the MEMS chip. The external contacts are connected in an electrically conductive way to the terminal surfaces of the MEMS chip and/or to other circuit elements. Preferably, the MEMS chip is connected only indirectly to the external contacts by means of other circuit elements, such as, e.g., by means of the chip component.

The chip component is connected either directly to the carrier substrate, or to terminal surfaces provided on this substrate and these terminal surfaces are connected to the external contacts of the carrier substrate. However, it is also possible to connect the chip component to the MEMS chip electrically and to provide for both connected components a common connection to the terminal surfaces of the carrier substrate.

The carrier substrate can have electrical feedthroughs, which are similarly constructed as via contacts. The carrier substrate can have a one-layer or multi-layer construction. It can include ceramic or plastic material and in the interior it can have one or more metallization layers, which are separated from each other by electrically insulating layers but which are connected to each other by means of the mentioned feedthroughs. In this way, a circuitry structure can be realized in the carrier substrate and connected to the MEMS chip and/or the chip component. The circuitry structure can also include passive components, which are constructed from structured metallization layers and which realize capacitors, inductors, or resistors.

Preferably, the one or more chip components compose an integrated circuit which interacts with the function of the MEMS chip. For example, the integrated circuit can be a control, evaluation, or amplification circuit or some other circuit arrangement used for operating the MEMS chip.

If the MEMS chip is not suitable for direct coating with a metallic shielding layer or if an embedded cavity, e.g., an acoustically active volume, is to be realized specifically, then an enclosure is arranged between the shielding layer and the MEMS chip. The enclosure can form a seal with the top side of the carrier substrate and can completely enclose the MEMS chip between itself and the carrier substrate. Such a large surface area enclosure can be realized, for example, in the form of a laminate film. This can be applied in such a way that it lies directly on the surfaces of the MEMS chip and carrier substrate or leaves intermediate spaces in some positions.

The laminate film is preferably a one-layer or multi-layer finished film that is converted into a hardened state during or after application, which can be effected, for example, by means of lamination. The laminate film, however, can also be generated by film casting directly on the surface of the carrier substrate and MEMS chip. In this case, a later hardening of the plastic material is also effected. However, it is also possible to generate the enclosure in a film form by means of a layer generation process, for example, by casting or spraying or by means of dip coating.

The enclosure, however, does not have to form a seal with the carrier substrate and can lie on or be attached to the top side of the MEMS chip, for example, only in the form of a cover. In this case, the cover can also be a plastic layer or can be constructed from a thick plastic film. Preferably, however, the MEMS chip is covered with a mechanically stable and especially rigid cover, which has a thermal expansion coefficient adapted to the material of the MEMS chip or the base chip. From this standpoint, materials such as glass, quartz, or semiconductor layers are suitable.

Such a cover can be adhered, bonded, soldered, or connected by means of bumps.

For certain functions of the MEMS chip it is necessary to provide above the MEMS chip an adequately sized recess, which is used for forming a back-side or reference volume or for exposing structures lying deeper in the MEMS chip. For this purpose it is possible to provide, in the enclosure formed as a cover, a recess that encloses together with the MEMS chip a cavity facing toward the MEMS chip.

In another construction, for enclosure of the MEMS chip the chip component is used as the cover, which lies on and is connected to the MEMS chip. The connection can include an electrical and a mechanical connection, wherein a flip-chip arrangement is preferred which realizes both connections in one step or with the same structure. This arrangement has the advantage that a simple electrical connection between the chip component and MEMS chip can be produced, that the MEMS chip is protected by the chip component, and that the chip component used as a cover allows the direct application of the shielding layer. Thus, overall an extremely space-saving arrangement is achieved, which is especially preferred with respect to the miniaturization of components.

The enclosure, however, can also be constructed as a cap. This has a contact surface for a bottom layer only in a peripheral edge region and rises therebetween above the contact level, so that sitting on flat bottom layers it can enclose underneath it a cavity. The cap is made from a rigid, electrically non-conductive material, for example, plastic. It is set on the carrier substrate and can be attached there, for example, by means of bonding or surface fusing. The MEMS chip is arranged in the cavity formed under the self-supporting cap.

It is also possible to arrange both the MEMS chip and also the chip component under the enclosure formed as a cap or in some other way. Furthermore, it is also possible to provide an enclosure only for the MEMS chip and to arrange the chip component next to it on the carrier substrate, but to provide both with a common shielding layer.

For various sensor functions of the MEMS chip, it is necessary that this be in direct contact with an outside atmosphere, especially when the MEMS chip is constructed as a pressure sensor or as a microphone. For this purpose, an opening through the shielding layer and the enclosure is provided above the MEMS chip, so that the MEMS chip is exposed to the outside from this side. The subsequent production of the opening is simplified if the enclosure does not contact the MEMS chip directly at least in a preferably central region, for example, it has a recess in the bottom side or itself has a cap-like shape and is seated on the MEMS chip or the carrier substrate while enclosing a cavity. However, it is also possible to provide the necessary opening in the carrier substrate underneath the MEMS chip.

If the enclosure is made from an electrically insulating material, and in particular, from a close lying film or layer, then a metallization structure, which is connected in an electrically conductive way either to the MEMS chip or to the chip component or to two components arranged one next to the other through contact holes formed in the first enclosure layer, can be realized on a first enclosure layer. Above the metallization structure, a second enclosure layer is deposited as an electrically insulating layer. The shielding layer is deposited above this second enclosure layer. With this metallization layer, connection to the carrier substrance can be realized from the MEMS chip and/or the chip component, and/or wiring can be realized between the two chips. In this case it is sufficient to attach components already electrically contacted by means of the metallization structure onto the carrier substrate by just mechanical means, for example, by adhesion bonding.

The MEMS chip can be attached, and in particular, bonded by an appropriate connection means onto the carrier substrate with its passive side that is opposite the active side. If the MEMS chip has a via contact running up to the active side with the active MEMS structures, then the connection means are made electrically conductive. It is possible, for example, to use an electrically anisotropic conductive adhesive, which guarantees electrical conductivity only transverse to the adhesive layer. Such anisotropic conductive adhesive has the advantage that it can be deposited over a large surface area, wherein a plurality of electrical connections can be simultaneously produced between corresponding contact surfaces on the MEMS chip and terminal surfaces on the carrier substrate, without their being short-circuited by the adhesive layer covering all of the contact surfaces.

In addition, the anisotropic conductive adhesive has the advantage that the separating joint between the carrier substrate and MEMS chip can be completely closed off. This is especially advantageous if the production of the enclosure and/or the metallic shielding layer can be realized only on a closed surface or if the bottom side of the MEMS chip has to be protected for a corresponding process of applying the enclosure or shielding layer, or if a cavity is to be left under the enclosure. This is especially important if MEMS structures located on the bottom side of the MEMS chip are exposed, and an appropriate method for producing the enclosure or shielding layer includes the use of a liquid phase.

However, the MEMS chip can also be connected to the carrier substrate by means of bonding wires. This can be advantageously combined with a rigid enclosure, which protects the MEMS chip without negatively affecting the bonding wire connection.

The MEMS chip and chip component are preferably mounted on the carrier substrate using flip-chip technology or one above the other, wherein the surface with the electrical contacts faces toward the carrier substrate and electrical and mechanical connections are produced between contact and terminal surfaces corresponding to each other and opposite each other in the mounted state, for example, by means of bump connections, solder connections, or electrically conductive adhesives.

The chip component can have an essentially smaller layer thickness than the MEMS chip. This allows the chip component to be arranged under the MEMS chip, that is, between the MEMS chip and carrier substrate. There it can be connected electrically and mechanically to the top side of the carrier substrate. It is also possible to arrange the chip component under the MEMS chip and to form an electrical and mechanical connection to the MEMS chip.

For a flip-chip arrangement of the MEMS chip by means of non-sealing connections, an additional joint seal can be provided. This can be, for example, an underfiller, which seals the joint peripherally from the outside after placement of the MEMS chip.

It is also possible to provide on the top side of the carrier substrate or on the corresponding side of the MEMS chip a frame-like structure whose top side represents an annular closed terminal surface for the MEMS chip or for the carrier substrate. The frame structure can be, for example, a solder frame, which also allows it to produce a solder connection between the carrier substrate and MEMS chip. However, the frame structure can also be made from a material that can be applied structured in some other way or structured at a later time, for example, one made from plastic, a structured plastic film, and in particular, from a structured resist.

However, it is also possible to form the frame structure integrated into the material of the carrier substrate or the MEMS chip. The corresponding electrical connection or contact surfaces are then set back relative to the level of the top edge of the frame, so that when the corresponding part contacts the frame structure, there is still space between the MEMS chip and the carrier substrate for the corresponding connection means, in particular, for the adhesive layer, solder connection, or bumps.

The MEMS chip and chip component can be arranged one next to the other on the carrier substrate and can be covered with a common large surface area enclosure, in particular, a laminate film. Preferably, the arrangement is made so that the laminate film encloses the MEMS chip and the one or more chip components separately against the top side of the carrier substrate. The shielding layer is the applied over a large surface area above the enclosure and preferably forms a seal with the top side of the carrier substrate.

Preferably, the MEMS chip is provided with a cover arranged under the enclosure, which covers either the sensitive MEMS structures on the active side or spans an optional upward-facing recess in the MEMS chip.

Even more advantageous is to use the chip component as the cover and to use at least one first laminate film as the enclosure which covers the MEMS chip provided with the chip component as the cover, and forms a seal all-around with the substrate. In this first enclosure layer, contact holes can be provided in which contact surfaces there exposed are connected to a metallization structure applied onto the first enclosure layer. By means of this metallization structure, the chip component can be connected electrically to terminal surfaces on the top side of the carrier substrate. The MEMS chip can be connected electrically and mechanically directly to the carrier substrate by means of an electrically conductive connection. In this case it is possible to bond the chip component as a cover on the surface of the MEMS chip that faces away from the carrier substrate, so that the contacts of the chip component point upward. However, it is also possible in addition to provide a direct connection between the chip connection and MEMS chip.

Preferably, however, the electrical connection is realized on the layer of the carrier substrate, for example, by conductor tracks provided on its surface or by a metallization and wiring layer buried in the interior of the carrier substrate or on the bottom side of the carrier substrate.

The MEMS chip can be constructed as a microphone in which an opening is provided in the enclosure and/or shielding layer or in which the MEMS chip is arranged above a sound opening in the carrier substrate. In addition, the MEMS package can have on the side opposite the sound opening or the perforation a sufficiently tightly closed back volume that represents a reference pressure for the MEMS chip and allows the measurement of a pressure difference relative to this reference pressure. This is necessary for applications as a pressure sensor or microphone.

The sound opening through which a MEMS chip constructed as a microphone or pressure sensor is connected to the outside environment can be formed as an opening in the carrier substrate, or as a perforation in the enclosure or shielding layer.

The back volume or reference volume is then formed on the side of the MEMS chip opposite the sound opening. On the passive side the back volume can be made available by a recess in the MEMS chip, and covered or closed accordingly.

If the passive side of the MEMS chip faces the sound opening, then the back-side volume is made available from the enclosure or the carrier substrate.

This can be realized in the form of a cover formed as a cap and sitting on the MEMS chip, or can be realized in the form of a cap sitting on the carrier substrate.

If the active side is facing the carrier substrate with the sound opening, the back volume is provided, for example, in a recess in the carrier substrate underneath the MEMS chip.

DESCRIPTION OF THE DRAWINGS

In the following, the MEMS package according to the invention and also suitable methods for its production will be explained in more detail with reference to embodiments and the associated figures. The figures are constructed purely schematically and not true to scale, so that neither absolute nor relative dimensional information can be taken from the figures. Shown in detail are.

DETAILED DESCRIPTION

Figure 1:
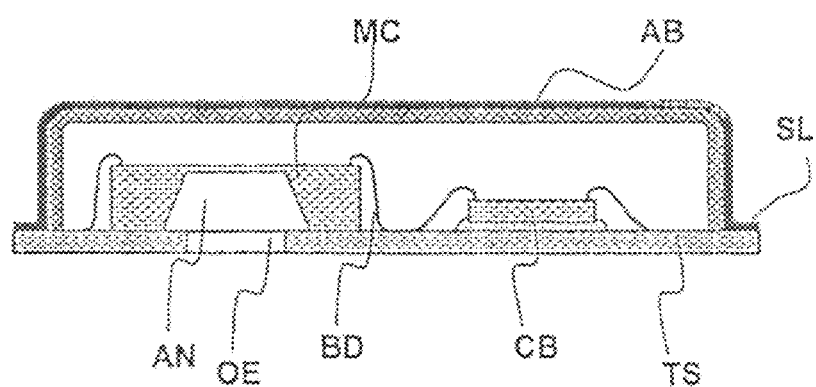
FIG. 1, a MEMS package, in which the MEMS chip and chip component are arranged under a cap and a metallic shielding layer and are contacted by means of bonding wires, FIG. 2, an arrangement in which, in contrast to FIG. 1, the MEMS chip is contacted electrically by means of a flip-chip arrangement, FIG. 3, an arrangement in which, in comparison with FIG. 2, the cap is replaced by a close-lying enclosure layer and the chip component has a glob-top encapsulation, FIG. 4, a MEMS package in which, in contrast to FIG. 3, the chip component also has a flip-chip arrangement and the MEMS chip is covered with a cover, FIG. 5, an arrangement in which the MEMS chip applied in a flip-chip arrangement also has a joint seal and in which the enclosure layer is eliminated, FIG. 6, an arrangement in which the chip component is attached to the carrier substrate between the MEMS chip and the carrier substrate, FIG. 7, an arrangement in which the chip component is arranged between the MEMS chip and carrier substrate and is attached to the former, FIG. 8, an arrangement in which the chip component lies on the through-contacted MEMS chip and is also covered with an enclosure having a recess, FIG. 9, an arrangement with the chip component lying on the MEMS chip, which are covered with a laminate film, FIG. 10, an arrangement similar to FIG. 8, in which, however, a perforation is provided in the cover, enclosure, and shielding layer, FIG. 11, an arrangement in which the chip component is arranged under the MEMS chip on the carrier substrate in a recess of the MEMS chip, and in which a perforation is provided in the cover, enclosure, and shielding layer above the MEMS chip, FIG. 12, an arrangement in which the MEMS chip and chip component are arranged one next to the other above a cavity in the carrier substrate, and wherein both cavities are connected to each other, FIG. 13, an arrangement in which the chip component is arranged next to the MEMS chip and is contacted electrically by means of a metallization structure, FIG. 14, an arrangement in which the MEMS chip is covered with the chip component and the chip component is connected in an electrically conductive way to the carrier substrate by means of a metallization structure.

FIG. 1 shows a simple embodiment of the MEMS package, in which the MEMS chip MC and chip component CB are mounted one next to the other on the top side of the carrier substrate TS and are attached there, for example, by means of adhesive. The electrical contacting of the two components to the carrier substrate is realized with bonding wires BD. The enclosure AB is made from a cap sitting on the carrier substrate, which encloses underneath a cavity HR. The cap can be adhesively bonded, for example, on the carrier substrate TS and is made, for example, from a prefabricated plastic part. The shielding layer SL is applied on the cap and the surface of the carrier substrate with a thin-film method and is optionally reinforced with wet-chemical or galvanic methods. For example, a two-step process is suitable in which initially a metallic adhesive layer—for example, made from titanium, nickel, chromium, tungsten, or copper—is sputtered and then reinforced with copper or nickel with a galvanic or electroless method from solution. Suitable layer thicknesses for fulfilling the shielding function then lie in the range between 10 and 100 μm. Preferably, the carrier substrate TS has a terminal surface connected to ground that seals the shielding layer and thus grounds the layer. The cavity HR under the enclosure AB formed as a cap is used as a back volume for the function of the MEMS chip. The MEMS chip MC has, on the passive side facing toward the carrier substrate, a recess AN in which the MEMS chip is thinned until the MEMS structures of the active side are exposed. Underneath the recess, an opening OE formed as a perforation is provided in the carrier substrate, so that the (passive) bottom side of the MEMS chip is connected in the region of the recess AN to an ambient atmosphere or an ambient pressure.

Not shown in the figure are external contacts arranged on the bottom side of the carrier substrate, by means of which the MEMS package can be mounted on a printed circuit board or another circuit environment. Naturally, the printed circuit board then also has a corresponding perforation, in order to guarantee, after assembly of the package, a connection to the surrounding atmosphere. However, it is also possible to provide external contacts on the top side of the carrier substrate and then to countersink the cap in a recess or opening of the printed circuit board and then to mount the MEMS chip head first.

The MEMS chip MC is designed, for example, as a microphone, the chip component CB, for example, as an amplifying component for the measurement signals generated by the MEMS chip.

As a carrier substrate TS, ceramic printed circuit board substrates are suitable in a multi-layer technology on a ceramic (HTCC—high temperature cofired ceramics, LTCC—low temperature cofired ceramics). Also suitable are high-temperature thermoplastics (e.g., PEI polyetherimide, PAEK polyaryl ether ketone, PSU polysulfone, PPS polyphenylene sulfide, PAI polyamidimide, PA polyamide, polyphthalamide, polybutylene terephthalate, or others) as the material for the carrier substrate TS, especially those in MID processing (molded interconnect device). Passive or active components can be embedded in the carrier substrate TS. In the case of a MEMS chip constructed as a microphone, these are in particular amplifiers or AD converters, and also devices protecting against EMI (electro-magnetic interference) and ESD (electro-static discharge).

Figure 2:
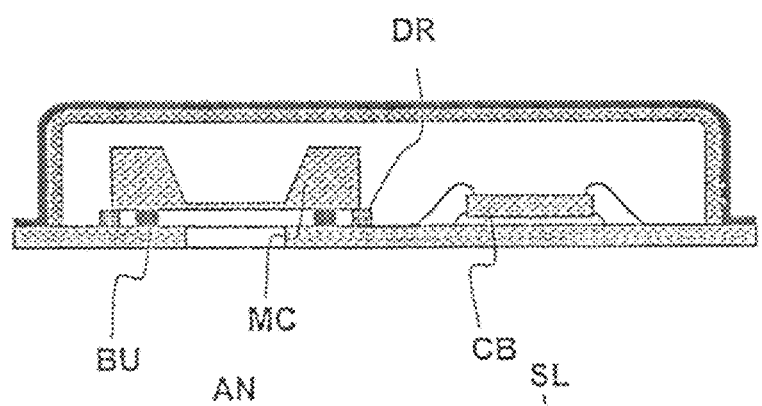

FIG. 2 shows another MEMS package, in which, in contrast to FIG. 1, the MEMS chip MC is attached in a flip-chip arrangement, e.g., by means of bumps BU, onto the carrier substrate TS. For this purpose, the MEMS chip is inclined vertically relative to FIG. 1, so that now the active side of the MEMS chip faces toward the surface of the carrier substrate. The electrical and mechanical connection can be realized by means of bumps or electrically conductive adhesive. If the adhesive does not sufficiently seal the back volume under the enclosure AB formed as a cap, so that the reference pressure provided there cannot be maintained long enough, then as shown in FIG. 2 a sealing frame DR (see figure), or alternatively an underfiller or some other joint seal, is provided so that the edge of the MEMS chip is sealed peripherally against the carrier substrate TS. The sealing frame can also be an adhesive applied after soldering of the MEMS chip MC. An anisotropic conductive adhesive can replace the illustrated bumps BU and can simultaneously realize a seal. Compared with FIG. 1, the back volume here is further enlarged.

Figure 3:
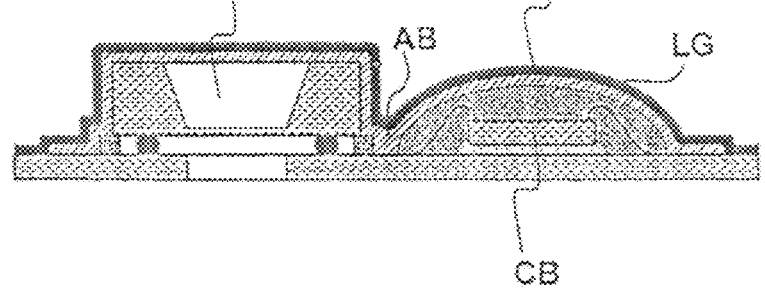

FIG. 3 shows an arrangement in which the MEMS chip MC and chip component CB are placed as in FIG. 2. Unlike there, here the chip component CB is covered, but with a directly applied protective encapsulation, for example, a glob-top mass LG. An enclosure layer, for example, a laminated laminate film, is applied as another enclosure AB both above the MEMS chip MC and also above the chip component CB provided with the protective enclosure LG. This fits tightly against the MEMS chip MC and can, as shown, span the recess AN on the (passive) bottom side of the MEMS chip MC. The shielding layer SL is in turn applied as a metallic layer on the surface of the enclosure layer, and forms an overall seal with the carrier substrate TS.

Due to the reduced back volume relative to FIGS. 1 and 2, if a back volume is actually required for the MEMS chip MC then this is selected to be sufficiently large. For this purpose, the recess AN is either enlarged or the thickness of the MEMS chip is increased until a sufficiently large back volume is obtained. For suitable processing control, especially if the enclosure layer tightly seals the back volume on the MEMS chip, then the sealing frame DR can be eliminated here.

Figure 4:
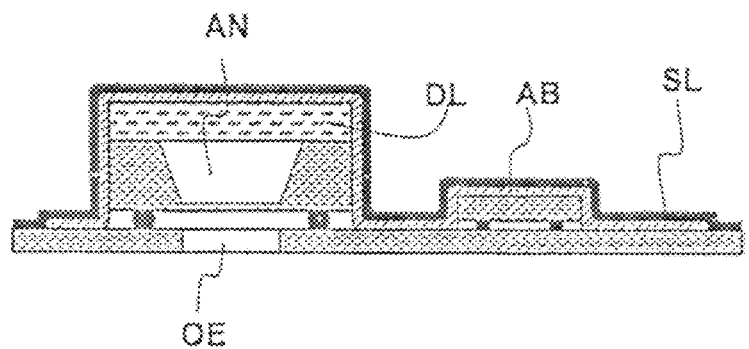

FIG. 4 shows a construction for a MEMS package in which the chip component CB is also placed in a flip-chip arrangement next to the MEMS chip MC on the carrier substrate TS. Because the electrical contacts of the chip component CB are protected in the intermediate space between the chip component and carrier substrate, here no additional enclosure of the chip component is required as in FIG. 3. The enclosure AB formed as an enclosure layer can lie directly on the reverse side of the chip component.

In another construction, a cover DL is placed above the MEMS chip MC. This simplifies the application of the enclosure layer, especially the lamination of the laminate film, in that it covers the recess on the top side of the MEMS chip MC and in this way encloses the back volume. For the cover DL a glass or plastic film, or alternatively, an appropriately thinned semiconductor layer can be used. A sufficient thickness is obtained at ca. 100 μm. Preferably, the MEMS chip is already provided at the wafer level with the cover, in which a correspondingly large surface area cover layer or a corresponding cover wafer is connected to the wafer in which the MEMS chip MC is advantageously produced. The connection of the MEMS wafer to the cover wafer can be effected, for example, by means of wafer bonding. Adhesive is also possible.

Figure 5:
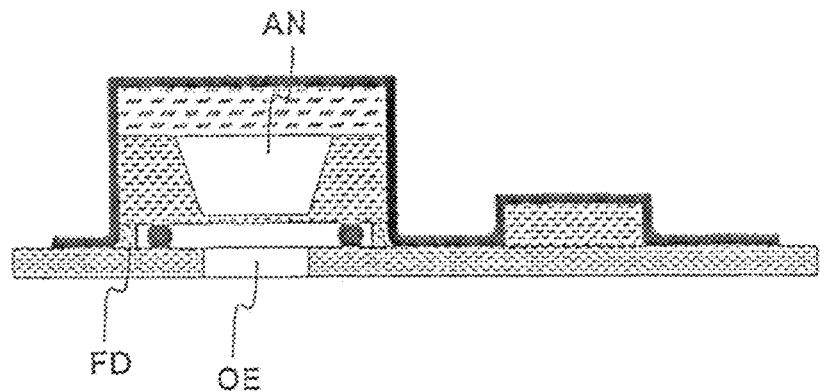

FIG. 5 shows an arrangement in which the enclosure layer is eliminated. The MEMS chip is covered only with a cover DL, which seals the back volume in the recess AN. If the MEMS chip MC is not attached with an electrically anisotropic conductive adhesive and thus already sealed, then the joint between the MEMS chip and carrier substrate TS is also sealed with a joint seal FD, for example, a sealing frame or an underfiller. This arrangement now allows a shielding layer SL to be applied directly onto the cover, the side surfaces of the MEMS chip and the surface of the carrier substrate, without having to take into account a negative effect on the MEMS function.

For depositing the shielding layer for the arrangement according to FIG. 5, processes of deposition from metal solutions can also be used, because a corresponding seal is bestowed on the MEMS chip. Here, the sound opening OE in the carrier substrate needs only to be temporarily closed, or one must proceed such that the sound opening is not exposed to the liquid. The chip component CB is preferably adhesively bonded to an anisotropic conductive adhesive, so that also here no additional seal is necessary. Not shown but also possible is to seal the chip component with a joint seal against the carrier substrate, in order to protect the contacts before the process of applying the shielding layer SL.

Figure 6:
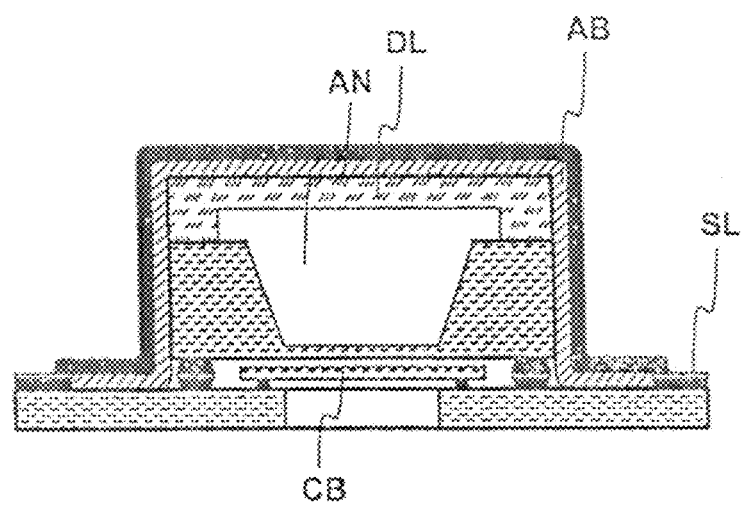

FIG. 6 shows a space-saving construction of a MEMS package in which the chip component CB is attached directly onto the carrier substrate TS not next to, but rather under the MEMS chip MC. In this way, the chip component CB can cover the opening OE in the carrier substrate as shown, so that the MEMS chip MC can nevertheless be in direct contact with the ambient atmosphere outside of the package and can receive a corresponding pressure. This construction is optimum with respect to the minimum required carrier substrate surface.

As another feature that can be combined independently with other constructions, here the MEMS chip MC is provided with a cover DL which has a cover recess above the recess AN of the MEMS chip itself, or is constructed as a cap sitting on the MEMS chip. The cover recess increases the back-side volume. The enclosure AB covers the MEMS chip or the cover and together with a shielding layer SL deposited above simultaneously guarantees sealing of the MEMS chip against the carrier substrate. In this case it is also possible to eliminate the enclosure layer and to optionally provide a joint seal on the MEMS chip bottom side.

Figure 7:
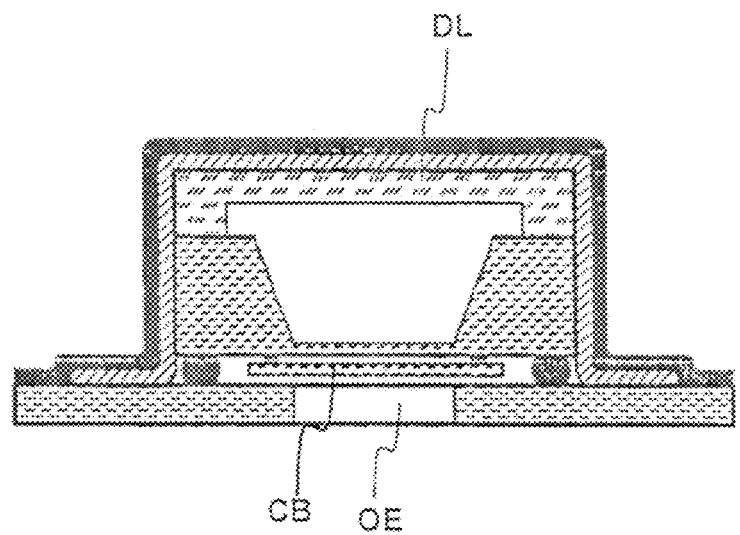

With a slight modification relative to FIG. 6, FIG. 7 shows a chip component CB similarly arranged under the MEMS chip MC, but connected to its bottom side. Here the chip component is placed so that the bottom side of the MEMS chip contacts the outside atmosphere. The remaining seal can be realized as shown in one of FIGS. 4 to 6, or as in FIG. 7.

For simplifying the method, the chip component CB can be already put in place on the wafer level on a MEMS chip wafer in which the MEMS chip is formed, before the individual MEMS chips are separated. Here it is possible to apply the chip component CB on an auxiliary carrier in a suitable pattern, so that the application of the chip component can be performed in parallel and simultaneously by means of the auxiliary carrier in the same way for all of the MEMS chips on the wafer.

FIG. 8 shows another carrier substrate surface-area-saving construction of a MEMS package, in which the chip component CB is placed on the (passive) top side of the MEMS chip MC, preferably in a flip-chip arrangement, which allows a simultaneous electrical connection of the chip component to the MEMS chip. For this purpose, the MEMS chip is provided, as shown, with a via contact DK which produces an electrical connection to the active side of the MEMS chip. The MEMS structures on the active side are in turn connected by means of corresponding conductive connections to terminal surfaces (not shown in the figure). An arbitrary number of via contacts and an optionally even larger number of contact surfaces are provided on the bottom side of the MEMS chip, which correspond to the required connections for the MEMS chip and the chip component CB. However, it is also possible to combine or divide connections, wherein the number of via contacts and connections increases or decreases accordingly.

If the chip component CB is not sufficiently mechanically stable, it can also be covered with a cap which sits on the MEMS chip and acts as a cover DL. The cap form can also be realized by a cover recess of corresponding size on the bottom side of the cover. The enclosure layer AS and shielding layer SL expand the arrangement. If necessary, the enclosure layer can also be eliminated.

FIG. 9 shows another construction for a MEMS package in which the chip component CB represents the cover for the MEMS chip MC, which is sufficiently stable so that an enclosure layer can be deposited or generated directly above as an enclosure AB without stability problems, and above this a shielding layer SL can be deposited or generated. The chip component is here preferably already connected at the wafer level to the MEMS wafer in which the individual MEMS chips are structured. For this purpose, the chip component is preferably coextensive with the MEMS chip, so that the two wafers can be connected to each other directly since they have the same pattern in the separation. However, it can be necessary here to realize electrical connections on the top side of the chip component by means of via contacts through the chip component (as shown in FIG. 9). Placement of the chip component in a flip-chip process on the (active) top side of the MEMS chip (not shown in FIG. 9) can form a direct electrical connection to corresponding connections of the MEMS chip, so that the via contacts through the chip component are then not necessary. The connection can be realized by means of solder or advantageously with anisotropic conductive adhesive.

FIG. 10 shows an arrangement in which the MEMS chip MC is connected to the carrier substrate TS via its base chip or its passive side, in comparison with the previous arrangements shown in FIGS. 2 to 9. This means that the back-side volume guaranteed by the recess AN in the base chip is now sealed off by the carrier substrate TS. The contact of the MEMS chip MC with the surrounding atmosphere must then be realized by means of a perforation DB in the cover DL, enclosure AB, and shielding layer SL. If the enclosure AB has sufficient stability, the cover DL can be eliminated and the cavity can be guaranteed, e.g., via a sacrificial layer on the MEMS chip which can be removed again after application of the enclosure AB and shielding layer and also after the opening of the perforation DB. The perforation DB can be generated in both cases after completion of the enclosure AB and after application of the enclosure layer and the shielding layer SL, for example, by drilling, in particular, by laser drilling. Larger or several smaller perforations can be provided.

Figure 11:
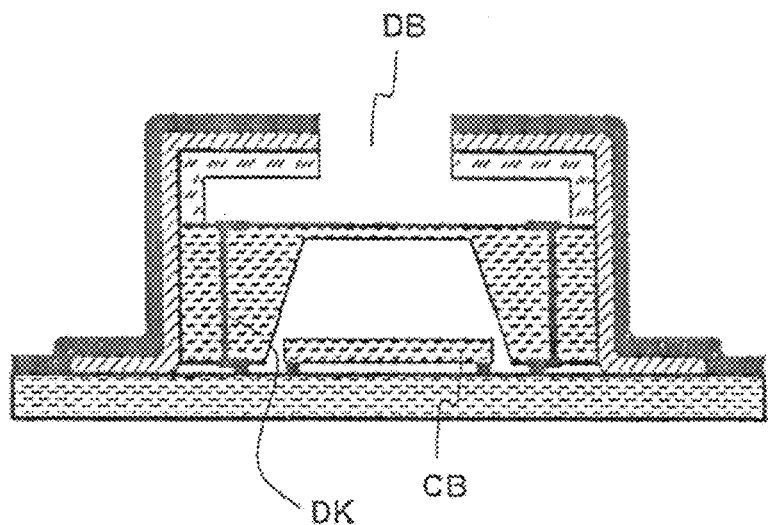

FIG. 11 shows an arrangement which similarly encloses the back-side volume between the MEMS chip and carrier substrate in the region of the recess AN. The volume is sufficient so that the chip component CB has room in the volume and can be connected to the carrier substrate TS under the MEMS chip in the region of the recess, for example, in a flip-chip arrangement by means of electrically conductive adhesive, bumps, or other bonding connection. Here, a connection of the top side of the MEMS chip MC to the surrounding atmosphere must be guaranteed by means of a perforation DB.

Figure 12:
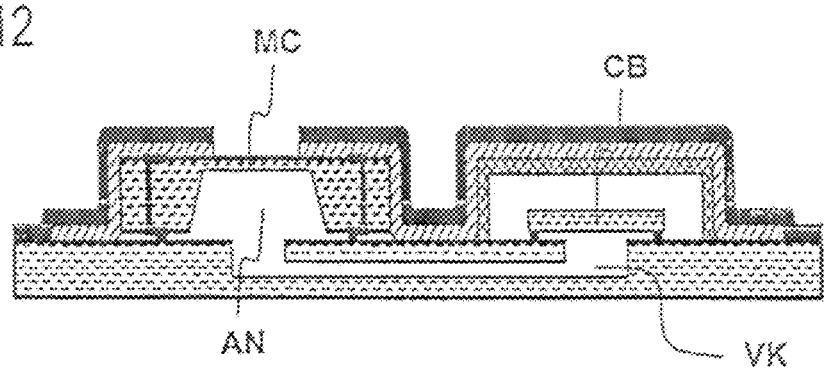

Because the back-side volume is limited to the chip size of the MEMS chip MC and is possibly too small according to the arrangement according to FIGS. 10 and 11, it can be enlarged by additional cavities VK in the carrier substrate TS. FIG. 12 also shows a construction in which another cavity is additionally provided under the chip component CB, this being connected to the cavity VK under the MEMS chip MC. The back-side volume is further enlarged without increasing the structural height or the surface area of the MEMS package.

Figure 13:
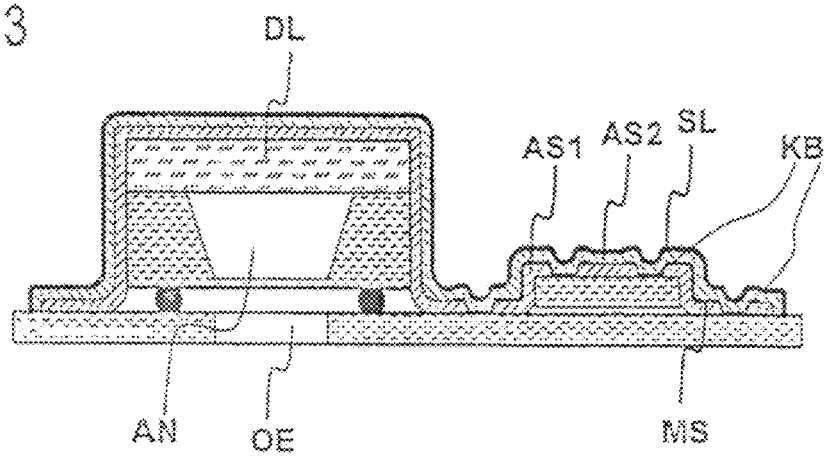

FIG. 13 shows a construction in which a metallization structure MS is arranged above a first enclosure layer AS1 and a second enclosure layer AS2 is arranged above this structure. The metallization structure connects electrically to contact surfaces of the chip component CB and terminal surfaces of the carrier substrate TS by means of contact holes KB in the first enclosure layer AS1 and thus represents an electrical connection structure. Therefore the chip component CB can be adhesively bonded onto the carrier substrate with the reverse side.

Figure 14:
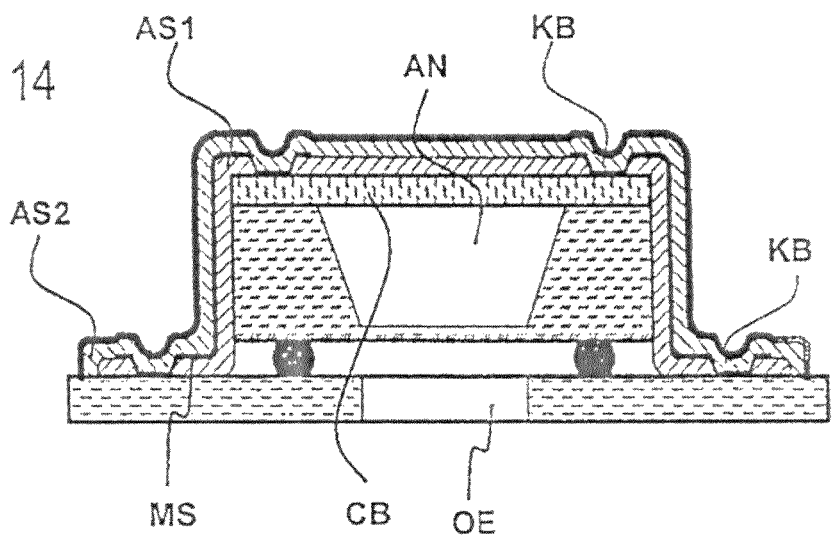

In FIG. 14, similar to FIG. 9, the MEMS chip MC is covered with the bonded chip component CB as a cover. The electrical connection of the chip component to the terminal surfaces of the carrier substrate TS is also realized here by means of a metallization structure MS, as shown in FIG. 13, which is connected to the contact surfaces of the MEMS chip MC by means of contact holes KB. The MEMS chip makes direct contact with the carrier substrate or its contact surfaces.

In none of the described embodiments is the back volume of the MEMS chip limited to the shown form (funnel-like opening), which is produced, e.g., by a defined etching method in single crystals, such as, e.g., silicon. Instead, other forms of the recess (vertical walls) can be more advantageous for reducing the MEMS chip. On the other hand, however, the chip-specific back-side volume formed by a recess could become too small, which would degrade the sensitivity of the microphone. One aid is already shown in FIG. 6, in which the enclosure AB has an additional recess.

Figure 15:
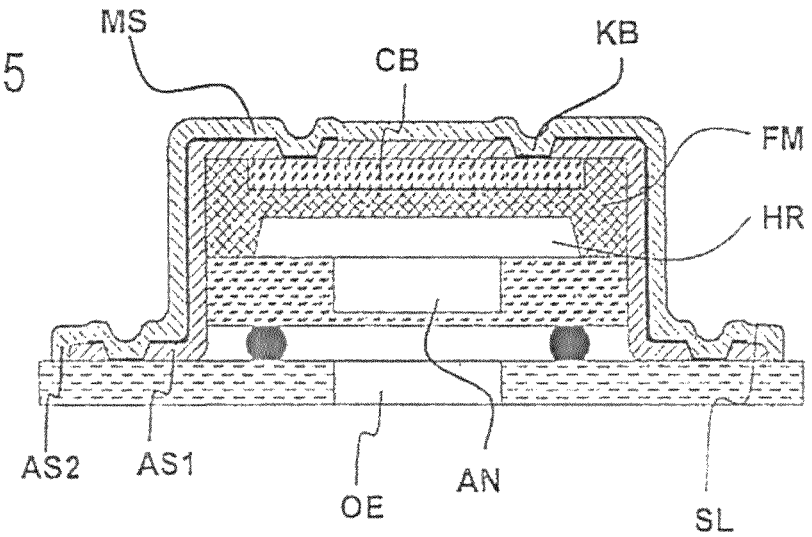
FIG. 15, an arrangement in which a molded part with an additional recess is arranged between the MEMS chip and chip component.
Figure 16A:
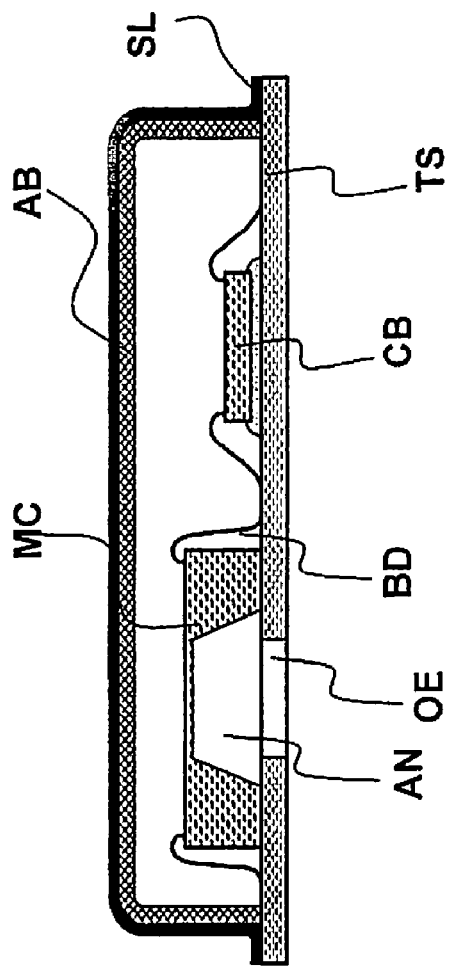
FIGS. 16A ad 16B show arrangements in which the chip component is arranged on the carrier substrate and embedded in the substrate, respectively.
Figure 16B:
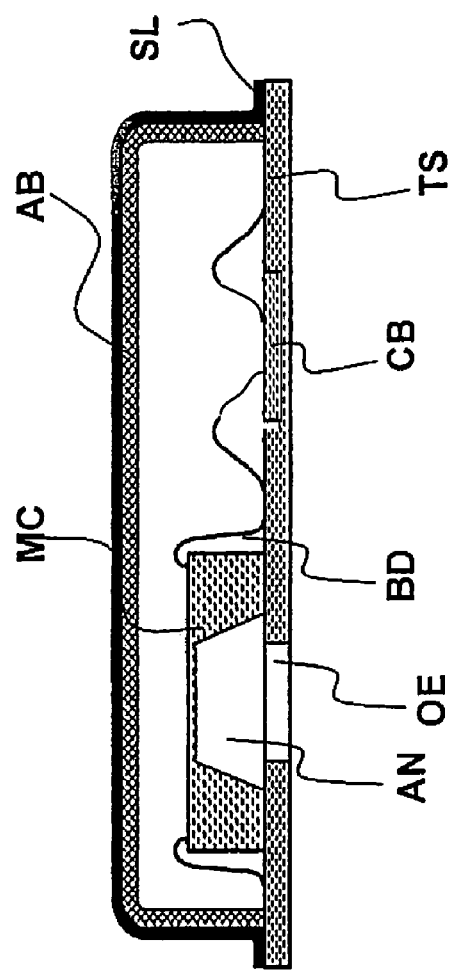
FIG. 16 shows a microelectromechanical system package where a chip component CB is embedded in the substrate TS.

If the chip component CB is to be used as a chip enclosure for the MEMS chip MC and in this way an additional back-side volume is to be created, the following solution is shown in FIG. 15. It has proven especially advantageous when the MEMS chip and chip component are to be already joined at the wafer level, even though the chip component is smaller. In this case, in a preliminary step, the (smaller) chip component is set with its connection side on an auxiliary carrier (e.g., an adhesive film), that is, at the spacing of the (larger) MEMS chip. In order to achieve a matched thermal expansion coefficient, this arrangement is then coated with a filled polymer filler FM, e.g., in a casting, pressing, or laminating process. In this way, a new wafer is obtained in which the chip components are now arranged fitting the counterpart. In this processing step an additional cavity HR can be pressed into the molded material FM in a simple way. For placement and bonding of the new wafer, the additional cavity is arranged above the MEMS chip MC and optionally forms, together with its recess AN, the back-side volume.

In a modified construction, an intermediate position with an additional cavity can also be formed by a separate molded part.

In addition, other combinations of the described details are also possible in modification of the shown constructions.

All of the embodiments are also especially suitable for arrays made from two or more MEMS chips formed as microphones. In this way directional characteristics can be set, for example, for reducing ambient noise. The back-side volumes are here allocated individually to each MEMS chip. In contrast, the electronic circuitry can combine several of these volumes.

The shielding layer SL on the top side of the carrier substrate on which the MEMS chip and possibly other components are located is of essential significance for shielding the sensitive internal signal processing relative to external interference fields. This is especially relevant for use in mobile telephony, where the component is often arranged only a few centimeters from the antenna. The processing sequence discussed above, lamination—sputtering—electroplating, is only one possibility for producing this coating with good conductivity. In a few embodiments, e.g., the lamination process can be eliminated (cf. FIG. 5). It is also possible to produce a corresponding layer through dipping, casting, or spraying instead of lamination. For the metallization of plastic surfaces, a series of PVD, CVD, wet-chemical, and galvanic methods (or combinations of these) is known. For a structured metallization structure MS (see FIGS. 13, 14, 15) for the purpose of circuitry, their photolithographic structuring or a selective metallization is provided, e.g., laser-activated deposition or direct writing of the metallization structure with a jet printing method.

All of the packaging variants described above with the example of a MEMS microphone or shown schematically in the figures are also suitable, in principle, for any other electronic components, especially for the enclosure of other MEMS chips including amplification, matching, or evaluation electronics. Typical examples are mechanical resonators and filters, pyrosensors, spectrometers, image converters in the visible or infrared spectral range, pressure sensors, gas sensors, turbidity sensors, loudspeakers, motion detectors, acceleration or gyro sensors, RFID chips, switches, tunable high-frequency components ("varactors"), fuel cells, thermoelectric generators, and many others.

Naturally, the sound opening can be eliminated. Then, with a suitable carrier substrate material, if necessary a hermetic and non-diffusion construction is possible or can be replaced by a window for other waves or radiation, or by a media inlet. The back side volume is then also obsolete in many cases.

The invention claimed is:

1. A micro electro-mechanical systems (MEMS) package, comprising:
   a ceramic carrier substrate having a top side, a MEMS chip mounted in a flip-chip configuration on the top side of the carrier substrate, at least one chip component on, or above, the top side of the carrier substrate or embedded in the carrier substrate, a metallic shielding layer above the MEMS chip and the at least one chip component, the metallic shielding layer forming a seal with the top side of the carrier substrate, and an enclosure between the metallic shielding layer and the MEMS chip; wherein:

the MEMS chip and the at least one chip component are electrically connected to each other or to external contacts on the carrier substrate;

the enclosure comprises a cover over at least part of the MEMS chip;

the MEMS chip and the at least one chip component are one next to the other and are electrically connected to terminal surfaces on the carrier substrate, the enclosure seals the MEMS chip and the chip component to the carrier substrate separately, and the metallic shielding layer is above the MEMS chip and the chip component.

2. The MEMS package of claim 1, wherein the enclosure comprises a laminate film applied above a surface area above the MEMS chip and the at least one chip component, the laminate film forming a seal with the carrier substrate.

3. The MEMS package of claim 1, wherein the enclosure comprises a rigid cap on the carrier substrate, the rigid cap and the carrier substrate defining a cavity, wherein the MEMS chip is in the cavity, and wherein the metallic shielding layer is directly on the rigid cap and on the carrier substrate in an edge region around the rigid cap.

4. The MEMS package of claim wherein the metallic shielding layer is in contact with the MEMS chip and contacts the cover, side surfaces of the MEMS chip and the top side of the carrier substrate.

5. The MEMS package of claim 1, wherein:

the MEMS chip has an active side that faces the top side of the carrier substrate, the MEMS chip being electrically and mechanically connected to the carrier substrate by one or more of bumps and electrically conductive adhesive, the cover is above a passive side of the MEMS chip facing away from the top side of the carrier substrate, the MEMS chip, the cover, and the at least one chip component are covered with the laminate film, and the metallic shielding layer is on an outward surface of the laminate film.

6. The MEMS package of claim 5, wherein the electrically conductive adhesive comprises an anisotropic conductive adhesive having a conductivity that is perpendicular an adhesion surface.

7. A method for producing a MEMS package, comprising:

mounting a MEMS chip in a flip-chip configuration on a carrier substrate, the carrier substrate comprising external contacts, the carrier substrate having a top side;

arranging a chip component on or above the top side of the carrier substrate, creating an electrical connection between the MEMS chip, the chip component, and the external contacts on the carrier substrate, adding an enclosure comprising a laminate film above the MEMS chip and the chip component to form a cover over the MEMS chip, and applying a metallic shielding layer comprising a metallic layer above the enclosure, the metallic shielding layer forming a seal with the top side of the carrier substrate; wherein mounting the MEMS chip on the carrier substrate comprises mechanically connecting the MEMS chip to the carrier substrate by one or more of bumps and electrically conductive adhesive, adding the enclosure to form the cover comprises adding the cover on a passive side of the MEMS chip facing away from the top side of the carrier substrate, adding the enclosure comprises covering the MEMS chip, the cover, and the at least one chip component with the laminate film and applying the metallic shielding layer comprises applying the shielding layer on an outward surface of the laminate film.

8. The method of claim 7, wherein the enclosure comprises a laminate film, the laminate film forming a seal with the carrier substrate around the MEMS chip and the chip component, and wherein applying the shielding layer comprises applying the shielding layer over a surface area on the laminate film and the carrier substrate such that the shielding layer forms a seal with the carrier substrate and is connected electrically at one or more positions to a contact surface of the carrier substrate.

9. The method of claim 7, wherein applying the shielding layer comprises generating the shielding layer at least partially by depositing metal from a solution.

10. The method of claim 7, wherein applying the shielding layer comprises generating the shielding layer at least partially by sputtering, a PVD or CVD process, or by evaporation of metal.

11. A micro electro-mechanical systems (MEMS) package comprising:

a ceramic carrier substrate having a top side, a MEMS chip mounted in a flip-chip configuration on the top side of the carrier substrate, at least one chip component on or above the top side of the carrier substrate or embedded in the carrier substrate, and a metallic shielding layer above the MEMS chip and the at least one chip component, the metallic shielding layer forming a seal with the top side of the carrier substrate, an enclosure between the metallic shielding layer and the MEMS chip, the enclosure forming a cover over at least a part of the MEMS chip; wherein:

the MEMS chip and the at least one chip component are one next to the other and electrically connected to each other or to external contacts on the carrier substrate;

an active side of the MEMS chip is electrically and mechanically connected to the carrier substrate by one or more of bumps and electrically conductive adhesive, the cover is above a passive side of the MEMS chip facing away from the top side of the carrier substrate, the MEMS chip, the cover, and the at least, one chip component are covered with the laminate film, the metallic shielding layer above the MEMS chip and the chip component and is on an outward surface of the laminate film; and the enclosure seals the MEMS chip and the chip component to the carrier substrate separately.

12. The MEMS package of claim 11, wherein the laminate film forms a seal with the carrier substrate.

13. The MEMS package of claim 11, wherein the enclosure comprises a rigid cap on the carrier substrate, the rigid cap and the carrier substrate defining a cavity, wherein the MEMS chip is in the cavity, and wherein the metallic shielding layer is directly on the rigid cap and on the carrier substrate in an edge region around the rigid cap.

14. The MEMS package of claim 11, wherein the metallic shielding layer is in contact with the MEMS chip and contacts the cover, side surfaces of the MEMS chip and the top side of the carrier substrate.

15. The MEMS package of claim 11, wherein:
the MEMS chip has an active side that faces the top side of the carrier substrate, the MEMS chip being electrically and mechanically connected to the carrier substrate by one or more of bumps and electrically conductive adhesive,
the cover is above a passive side of the MEMS chip facing away from the top side of the carrier substrate,
the MEMS chip, the cover, and the at least one chip component are covered with the laminate film, and
the metallic shielding layer is on an outward surface of the laminate film.

16. The MEMS package of claim 15, wherein the electrically conductive adhesive comprises an anisotropic conductive adhesive having a conductivity that is perpendicular an adhesion surface.

17. The MEMS package of claim 11, wherein the carrier substrate comprises a diffusion-resistant, material and the metallic shielding layer binds to the diffusion-resistant material circumferentially.

18. The MEMS package of claim 1, wherein the carrier substrate comprises a diffusion-resistant material and the metallic shielding layer binds to the diffusion-resistant material circumferentially.

* * * * *

UNITED STATES PATENT AND TRADEMARK OFFICE
CERTIFICATE OF CORRECTION

PATENT NO. : 8,432,007 B2
APPLICATION NO. : 13/075936
DATED : April 30, 2013
INVENTOR(S) : Wolfgang Pahl et al.

Page 1 of 2

It is certified that error appears in the above-identified patent and that said Letters Patent is hereby corrected as shown below:

Title Page, Column 2, Other Publications, Line 2;
Delete "Corss" and Insert -- Cross --

Title Page 4, Column 1, Line 40;
Delete "Techological" and Insert -- Technological --

Title Page 4, Column 2, Line 1;
Delete "Mircrofluidic" and Insert -- Microfluidic --

Title Page 4, Column 2, Line 29;
Delete "Automotice" and Insert -- Automatic --

Title Page 4, Column 2, Line 52;
Delete "Piezoeclectric" and Insert -- Piezoelectric --

In the Claims:

Column 13, Claim 4, Line 35;
Delete "claim" and Insert -- claim 1, --

Column 13, Claim 6, Line 53;
Delete "perpendicular" and Insert -- perpendicular to --

Column 14, Claim 11, Line 35;
Delete "package" and Insert -- package, --

Column 14, Claim 11, Line 59;
Delete "least," and Insert -- least --

Signed and Sealed this
Sixth Day of August, 2013

Teresa Stanek Rea
*Acting Director of the United States Patent and Trademark Office*

CERTIFICATE OF CORRECTION (continued)
U.S. Pat. No. 8,432,007 B2

Column 16, Claim 16, Line 7;
Delete "perpendicular" and Insert -- perpendicular to --

Column 16, Claim 17, Line 10;
Delete "diffusion-resistant," and Insert -- diffusion-resistant --